United States Patent [19]
Antonello et al.

[11] Patent Number: 5,523,698
[45] Date of Patent: Jun. 4, 1996

[54] SYSTEM FOR MAKING TESTED PRINTED CIRCUIT BOARDS IN CIRCUIT BOARD TESTING MACHINES

[75] Inventors: Gianpaolo Antonello; Graziano Bagioni, both of Verona, Italy

[73] Assignee: Circuit Line S.p.A., Verona, Italy

[21] Appl. No.: 385,823

[22] Filed: Feb. 9, 1995

[30] Foreign Application Priority Data

Feb. 24, 1994 [IT] Italy ................... MI94A0342

[51] Int. Cl.⁶ .................................................. G01R 1/06
[52] U.S. Cl. ........................................ 324/759; 324/754
[58] Field of Search ........................... 324/759, 761, 324/158.1, 73.1, 765, 764, 72.5; 437/8; 33/34–37, 41.3, 41.4, 44, 18.1

[56] References Cited

U.S. PATENT DOCUMENTS

| | | | |
|---|---|---|---|
| 3,185,927 | 5/1965 | Margulis et al. | 324/759 |
| 4,568,879 | 2/1986 | Nakamura et al. | 324/759 |
| 4,947,114 | 8/1990 | Schindlbeck | 324/764 |
| 5,416,428 | 5/1995 | Swart | 324/759 |

FOREIGN PATENT DOCUMENTS 2637877  3/1978  Germany.

OTHER PUBLICATIONS

Patent Abstracts of Japan, vol. 6 No. 121 (P–126) [999], Jul. 6, 1982 & JP–A–57 049844 (Hitachi) 24 Mar. 1982.

*Primary Examiner*—Vinh P. Nguyen
*Attorney, Agent, or Firm*—Sixbey, Friedman, Leedom & Ferguson; Charles M. Leedom, Jr.; David S. Safran

[57] ABSTRACT

A system for marking printed circuit boards (4), that can be applied to machines (1) for electrically testing printed circuit boards, in which the circuit to be tested is positioned in the test area of the machine, where a constant-pitch grid, or pin bed is provided, with an adapter (6) interposed between said pin bed and the printed circuit board (4), the marking system comprising at least one marking element (20) located in the adapter (6) and including a pad (21) that is moved linearly by means of an electric actuator (27, 26, 25), on a command given by the testing machine itself, through a pair of points in the pin bed.

17 Claims, 4 Drawing Sheets

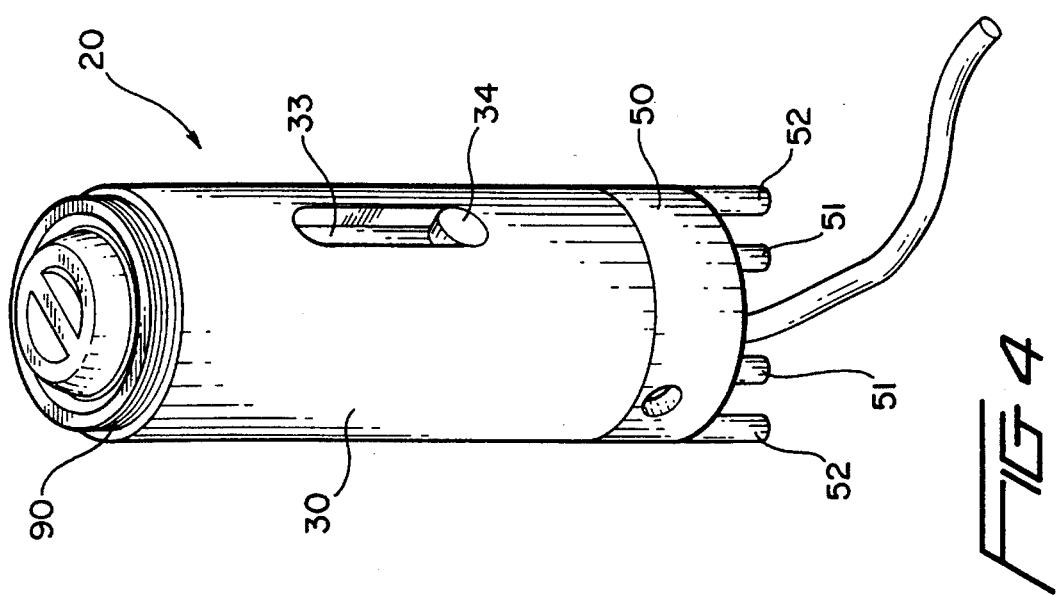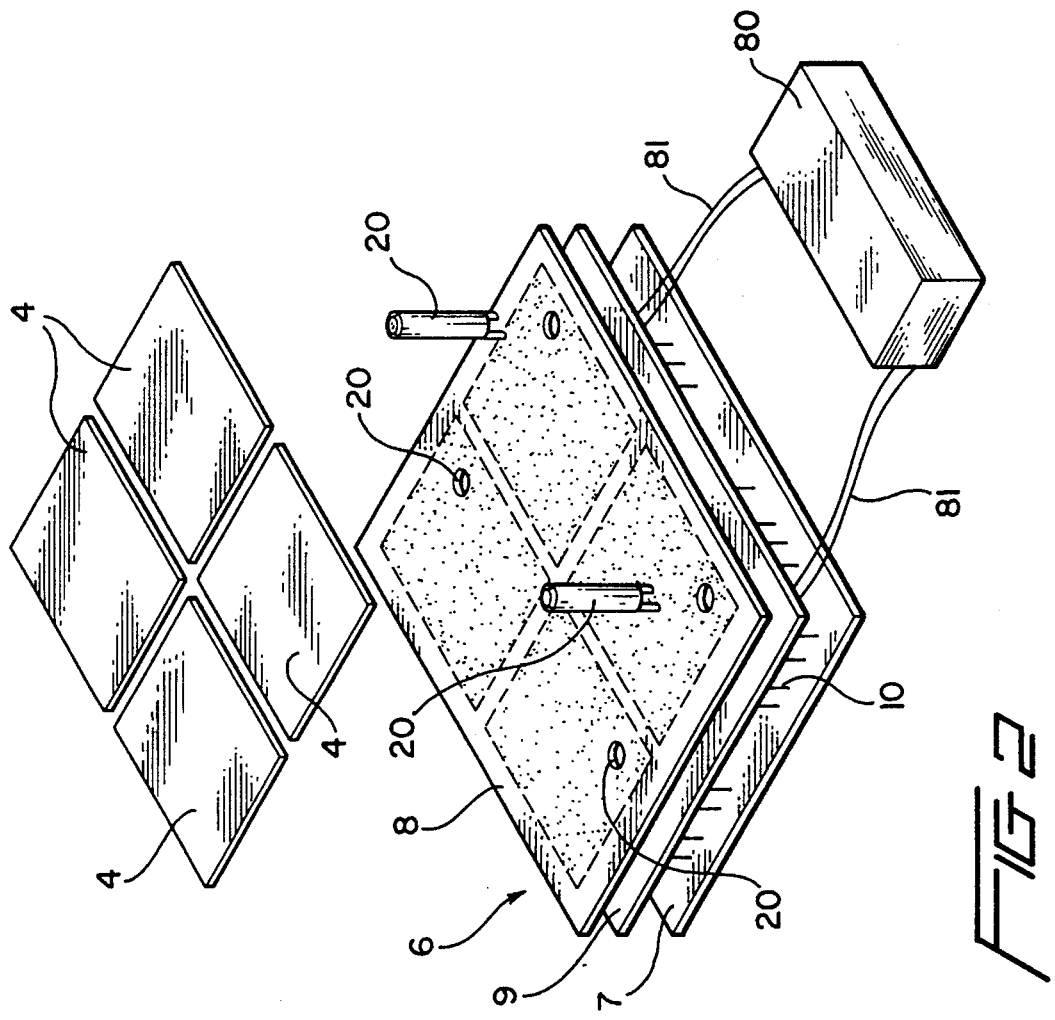

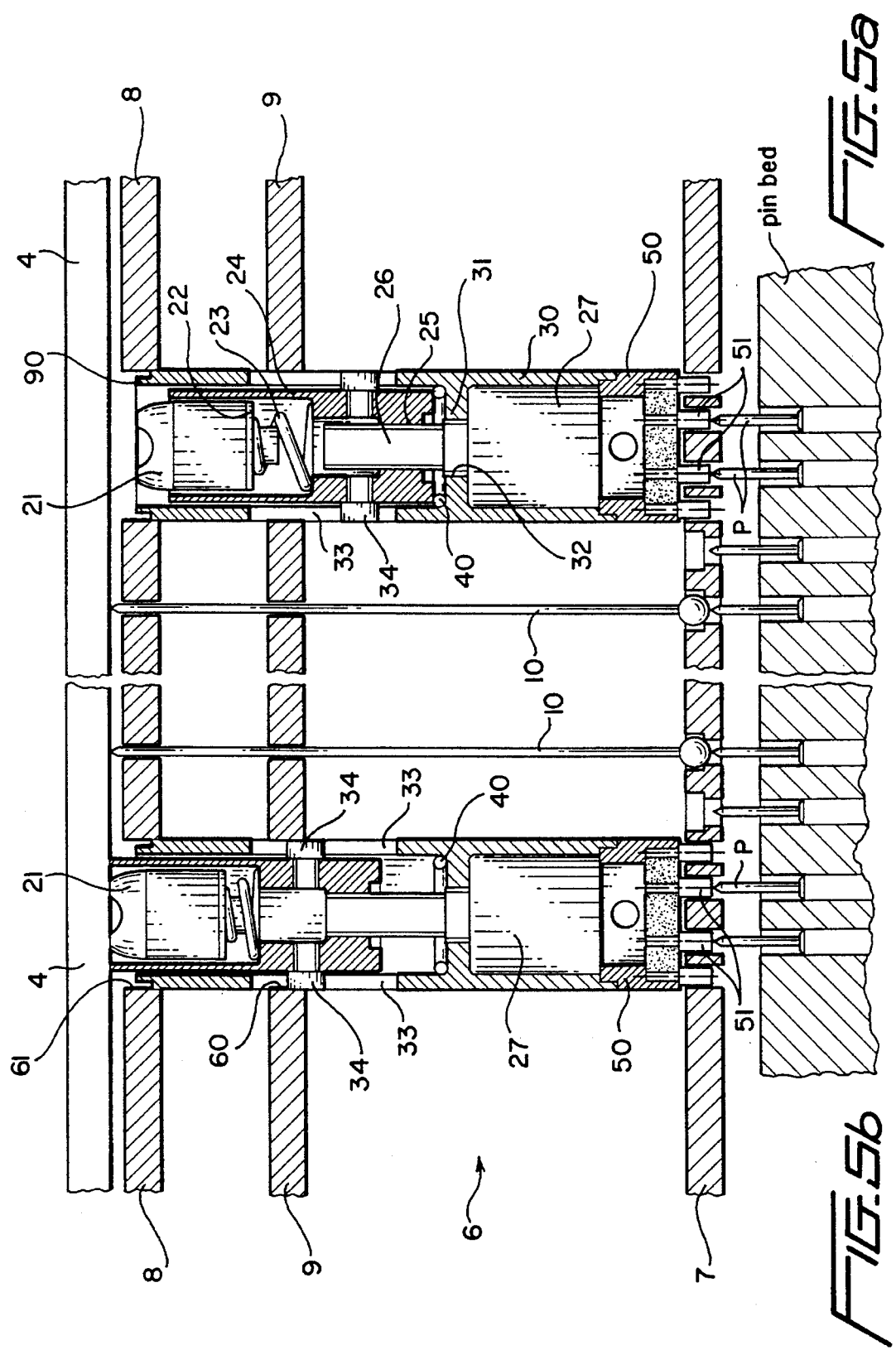

SYSTEM FOR MAKING TESTED PRINTED CIRCUIT BOARDS IN CIRCUIT BOARD TESTING MACHINES

DESCRIPTION

The present invention relates to a marking system for printed circuit boards that can be applied to machines for electrically testing printed circuit boards.

As is known, a printed circuit board (PCB) is a base of insulating material on which electrical connections are marked, generally by means of a subtractive process, to link the various components that are to be installed on the circuit itself, generally by soldering.

These printed circuit boards are tested before installation of the components, that is to say they are checked and analyzed to ensure that all the nets present on it are insulated from each other and that there is electrical continuity between all points in each net.

This operation is done with special testing machines which may be automatic, semiautomatic or manual, in which the printed circuit boards are loaded and tested according to a method that can be considered known in itself.

In particular, in the test area of the machine a "pin bed" is provided, that is to say a set of contacts situated on a constant pitch grid, on which, or beneath which, the printed circuit to be tested is placed.

Since the printed circuit has connection points between the different components arranged in a variable manner—and therefore not referable to a constant pitch grid—in order to carry out the test, a translating or adapting element, called a "fixture", is interposed between the pin bed and the printed circuit to be tested.

The fixture is a customized element whose form depends upon the printed circuit that must be tested and it too has a plurality of pin contacts that make an electrical connection between corresponding contacts on the constant pitch grid (pin bed) and the points of the printed circuit to be tested.

The electrical test machine is substantially a press that allows the above mentioned electrical contact to be made between the points of the test area (fixed grid) and the points of the circuit to be tested, through elastic elements situated, in general, in the fixture.

The electrical test stage serves to establish whether the printed circuit must be passed or not. The importance of identifying with certainty any test with a negative result, which corresponds to a faulty printed circuit, is therefore apparent.

The majority of electrical test machines existing on the market today requires operator intervention to carry out printed circuit loading/discharge operations and for separation of faulty circuits from working ones.

In practice, the testing machine gives a visual and/or acoustic indication of faulty circuits with a printout of the errors. The operator sorts the "failed" circuits from the "passed" ones and attaches the relative printouts provided by the machine to the failed boards.

It is obvious that this procedure, besides being laborious in itself, leads to frequent selection errors due to the human intervention, which have repercussions on the quality of the end product.

Automatic loading/discharge systems also exist, allowing automatic-selection control, that can be justified only for very large batches of circuits, for example exceeding 100,000 units/month. In these systems the printed circuits are taken automatically from a loading magazine, tested and selected, and sent to their respective unloading magazines, in which, therefore, the working circuits are already separated from the faulty ones. During the circuit board discharge phase, the passed circuits can be marked by devices installed, for example, on the transport trolleys.

A purpose of the invention is to create a printed circuit marking system that can be applied to any machine for the electrical test on printed circuits, whether it be automatic or semi-automatic, with operator intervention for loading and/or unloading the circuits.

Another purpose of the invention is to provide such a marking system that operates directly inside the test machine, and therefore without any possibility of operator intervention.

Yet another purpose of the invention is to provide a marking system that allows the same number of marking elements to be disposed as the number of circuits that are processed for each test cycle, in the event of multiple tests.

These purposes are achieved with the marking system according to the invention.

The marking system according to the invention comprises at least one marking element disposed inside the fixture of the testing machine.

The marking command is conveniently given directly by the testing machine, through a pair of points in the test area.

The marking element consists of a linear actuator, preferably an electric (or even pneumatic) actuator, having at one end a pad which marks, for example, the printed circuits that have a positive test result.

Further characteristics of the invention will be made clearer by the detailed description that follows, referring to a purely exemplary, and therefore non-limiting, embodiment illustrated in the annexed drawings in which:

FIGS. 1a–14d schematically illustrate the various phases of a test cycle for a printed circuit, with manual loading and unloading;

FIG. 2 is a schematic axonometric view illustrating a fixture for simultaneously testing a plurality of printed circuits, provided with a marking system according to the invention;

FIG. 4 shows the marking element in FIG. 3 in the assembled condition;

FIG. 5a is an axial section through a marking element in the resting position;

FIG. 5b is a section like that in FIG. 5a showing the marking element in the operating phase.

Figure 1A:
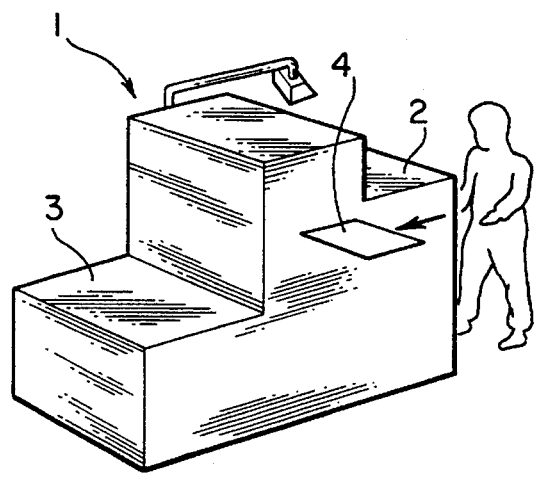
Figure 1B:
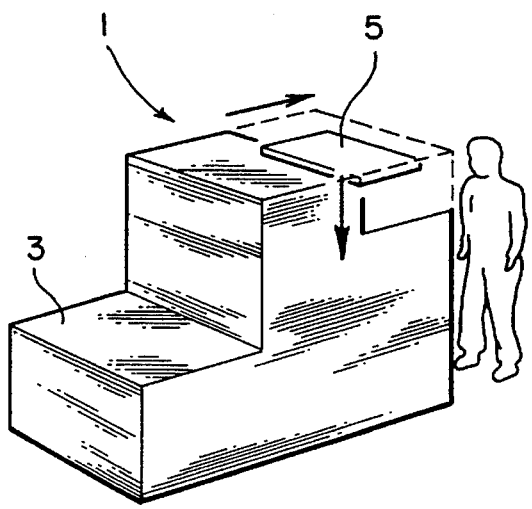
Figure 1C:
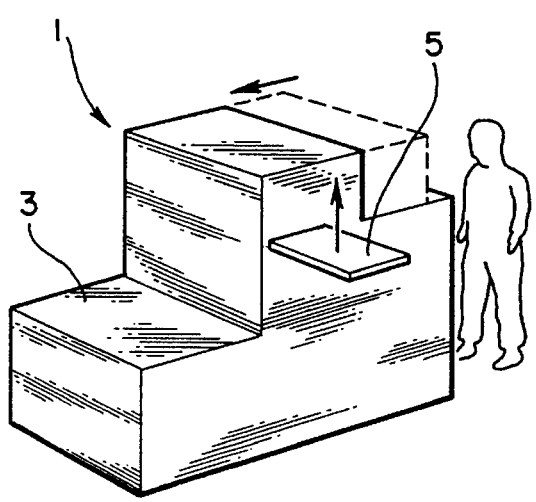
Figure 1B:
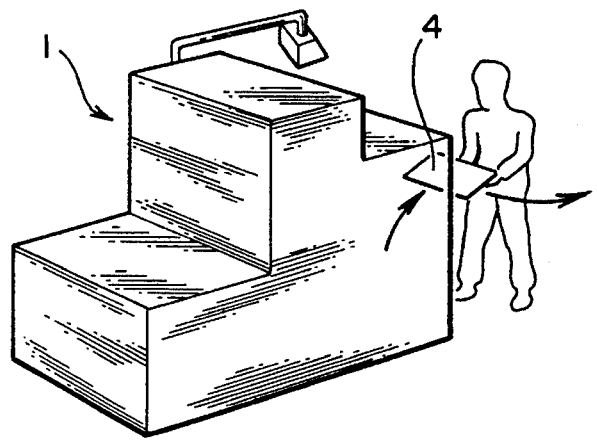
Figure 3:
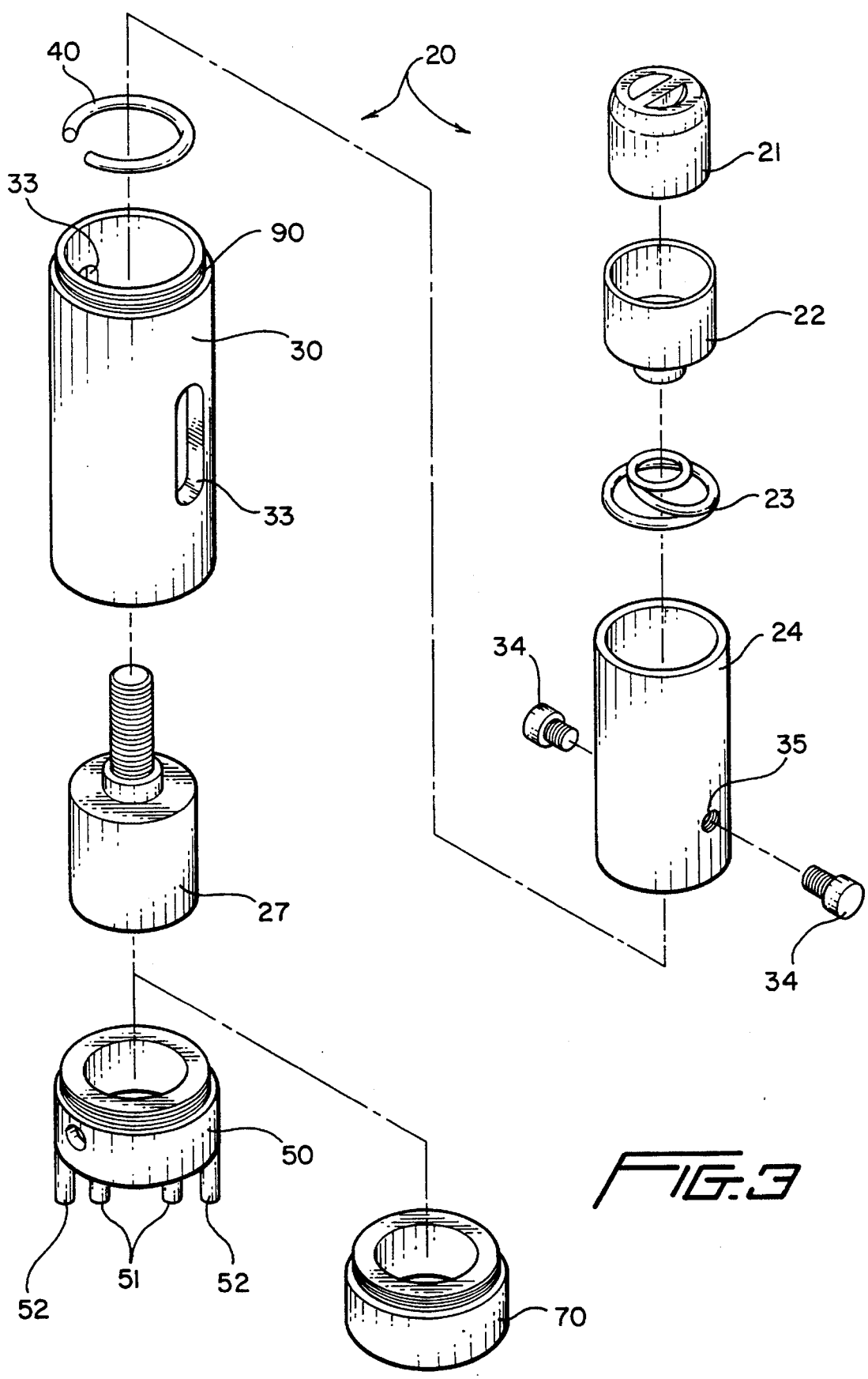
FIG. 3 is an exploded view of a marking element according to the invention.

With reference first to FIGS. 1a–1d, a machine for testing printed circuit boards has been shown as a whole by the number 1.

The machine illustrated comprises, in particular, two stations: a work station 2, where the circuit is tested, and a loading section 3, from which the circuits for testing are moved automatically into the work station 2. The two stations 2 and 3 are mutually exclusive, in that the circuits can be loaded in station 3, transferred automatically to the test station 2 and then brought back, again automatically, into the station 3, after the test, in a manner that will not be further described in that it is irrelevant for the purposes of the invention. Alternatively, the circuit for testing, indicated by reference number 4, can be loaded directly into the test station 2 by the operator, as illustrated schematically in FIG.

1a. The operator then starts the test cycle and the machine doses the test area (see hatched line in FIG. 1b and 1c) and lowers the press 5 onto the circuit that is to be tested. Once the test has been performed, the operator removes the circuit board from the machine (FIG. 1d).

The testing machine 1 has been illustrated in the configuration in FIGS. 1a and 1d purely by way of example, to better explain the object of the invention, it being understood that the invention can be applied to any type of testing machine.

As concisely explained in the introductory part of this description, the printed circuit board 4 is tested by placing it on a translating element or fixture 6 (FIG. 2), which in turn is placed on a constant pitch pin bed, only the upper portion of which is shown in FIGS. 5a and 5b.

The fixture 6 comprises two terminal plates 7, 8, the first designed to be disposed on the pin bed, the second designed to receive one or more printed circuits 4, and possibly one or more intermediate plates 9.

A plurality of needle or pin contacts 10 rises from the lower plate 7, passing through the intermediate plate 9 which acts as a guide and protruding from holes in the upper plate 6, to come into contact with well defined points on the printed circuit 4 to be tested. Distance pieces (not shown), which may be rigid or flexibly yielding, will be disposed between the plates 7, 8 and 9.

FIG. 2 shows a fixture 6 that can receive four printed circuit boards 4 at the same time, for simultaneous testing.

The marking system according to the invention comprises marking units, in particular stamps 20, inserted in the fixture (6), in an equal number to the number of printed circuits 4 that can be tested simultaneously, In the example in FIG. 2, four marking elements 20 are provided, two of which are shown removed from the fixture 6.

One of these marking units 20 will now be described in greater detail with reference to FIGS. 3, 4, 5a and 5b.

The marking unit 20 comprises a marking element in the form of an inked pad 21 that is moved along the vertical axis by an electric actuator, in the manner described in greater detail below.

In particular, the pad 21 is housed in a cup 22, in turn housed, after interposition of a spring 23, in a cylindrical element 24, inside the lower part of which a lead screw or lead nut 25 is provided, with which the screw shaft 26 of a motor 27 engages.

The whole assembly is housed in a tubular cylindrical supporting shell 30, having a wall at right angles to the longitudinal axis 31, with a hole 32 in the centre, so that the motor 27 is disposed beneath the wall 31 and the screw 26 passes through the hole in it 32, to engage with the lead screw 25 of the cylindrical element 24, which, on the other hand, is disposed above the wall 31, as shown in FIGS. 5a and 5b.

Two opposite vertically extending slots 33 are also provided in the shell into which are inserted respective studs 34 screwed into holes 35 in the cylindrical element 24 with lead screw 25.

In this way, a rotation in one direction or the other of the screw 26 produces an upward or downward translation of the lead nut 25, which is prevented from rotating by the studs 34 which engage in the slots 33.

As shown in the drawings, the cylindrical element 24 with the lead screw 25 rests on the dividing wall 31 after interposition of an elastic element 40, such as an OR ring or a spring.

The motor 27, on the other hand, is supported below by a terminal element or connection 50, which screws onto the shell 30, and has pairs of positioning and centering pins 51, 52, two of which, for example pair 51, receive the marking command directly from the testing machine through a pair of pins P in the pin bed beneath, on which the pins 51 come to rest.

As can be seen in FIGS. 5a and 5b, the tubular cylindrical shell 30 is inserted into the corresponding holes 60, 61 provided respectively in the intermediate plate 9 and the upper plate 8 supporting the printed circuit board 4.

The overall height of the marking unit 20, that is of the tubular shell 30 and the terminal connection element 50 substantially corresponds to the height of the fixture 6, that is to the distance between the outer plates 7 and 8.

For this purpose, to make the marking unit 20 utilizable with fixture 6 of different heights, it can be telescopically elongated, by providing modular connection devices such as ring nuts 70 that are interposed between the terminal connection 50 and the tubular shell 30, until it reaches the desired height.

A feed and marking control device 80 is also provided, connected to the marking elements 20 by means of cables 81, which receives the control pulses directly from the testing machine.

From what has been described, it is clear how the marking machine according to the invention works.

Supposing that the printed circuit boards that have passed the test have to be marked, on a command given by the testing machine through the pair of pins in contact with the pins 51, the motor 27 that turns the screw 26 in a direction that causes lifting of the cylindrical element 24 with screw nut 25, and thus of the pad 21, which is made to press elastically against the printed circuit board 4, as shown in FIG. 5b.

The control device 80 detects the current peak that occurs at the end of the stroke, due to the impact with the printed circuit board, and inverts the polarity of the current to the motor 27, inverting its motion and thus causing lowering of the element 24 with screw nut 25, whose arrest is cushioned by the elastic element 40.

To facilitate extraction of the marking unit 20 from the adapter 6, at the top of the shell 30, a thread 90 is provided on which an extension element can be screwed.

It will be noted that the marking element 20 according to the invention also allows the exact position in which marking of the circuit board occurs to be identified through the pair of pins P in the pin bed in contact with the pins 51.

It is also obvious that any other type of actuator can be used in place of the screw and female thread electrical actuator, for example a solenoid, or else a pneumatic or other type of actuator.

We claim:

1. A printed circuit board marking system for printed circuit testing machines in which a printed circuit board to be tested is positioned in a test area of the machine, said marking system comprising a constant pitch array of a plurality of pins, a fixture for receiving at least one printed circuit board at a first side thereof and said plurality of pins being disposed an opposite second side of said fixture; wherein the fixture comprises a plurality of plates passed through by a plurality of contacts; wherein at least one marking unit having a marking element is disposed in said fixture and has at least one mobile assembly which is connected to said at least one marking element and is movable between a resting position in which said at least one marking element is disposed inside the fixture and a working position in which the marking element extends from said fixture at said first side thereof for engaging a printed circuit board received on the fixture in order to mark it; and actuating means for initiating movement of said mobile assembly between said resting and working positions, said actuating means comprising at least some of said plurality of pins other of said plurality of pins engaging said plurality of contacts.

2. A marking system according to claim 1 characterized by the fact that said fixture (6) is provided with a plurality of marking elements (20), the number of which is at least equal to the number of printed circuit boards (4) that can be received simultaneously on the fixture.

3. A marking system according to claim 1 characterized by the fact that said marking element (20) comprises an inked pad (21) and an actuator for axially moving the ink pad.

4. A marking system according to claim 3, characterized by the fact that said mobile assembly comprises a motor (27), with a screw shaft (26) that engages with a female screw or screw nut (25) of a cylindrical element (24) supporting said pad (21) and blocked in rotation, so that a rotation of the screw (26) causes a translation of the cylindrical element (24) and thus of the pad (21).

5. A marking system according to claim 3, characterized by the fact that said marking unit (20) comprises an outer shell (30) with a terminal connection (50) at one end of the outer shell, the pad (21) being housed at an opposite end of the outer shell, and a connection provided with pairs of pins (51, 52) for positioning and centering the mobile assembly on said plate (7).

6. A marking system according to claim 5, characterized by the fact that said marking unit (20) is of a modular type, ring nut connections (70) being provided between said shell (30) and said terminal connection (50), to adapt its length to the height of the fixture (6).

7. A marking system according to claim 5, characterized by the fact that said shell (30) has a thread (90) for engaging an extension element at the end of the shell housing the pad (21), suitable for facilitating extraction of the marking unit (20) from the fixture (6).

8. A circuit board testing machine for performing electrical tests on printed circuit boards comprising a test area having a constant pitch array of a plurality of pins and a fixture for receiving at least one printed circuit board at a first side thereof are disposed with said plurality of pins located at an opposite second side of said fixture; wherein said fixture comprises a plurality of plates passed through by a plurality of contacts; wherein a marking unit is provided in said fixture, said marking unit comprising at least one marking element disposed in said fixture and having at least one mobile assembly which is connected to said at least one marking element and is movable between a resting position in which said at least one marking element is disposed inside the fixture and a working position in which the marking element extends from said fixture at said first side thereof for engaging a printed circuit board received on the fixture in order to mark it; and wherein at least some of said plurality of pins engage said mobile assembly for initiating movement of said mobile assembly between said resting and working positions and some of said plurality of pins engage said plurality of contacts.

9. A machine according to claim 8, characterized by the fact that the marking unit (20) comprises an inked pad (21) and an actuator for axially moving the ink pad.

10. A machine according to claim 8, characterized by the fact that said mobile assembly comprises a motor (27), with a screw shaft (26) that engages with a female screw or screw nut (25) of a cylindrical element (24) supporting said pad (21) and blocked in rotation, so that a rotation of the screw (26) causes a translation of the cylindrical element (24) and thus of the pad (21).

11. A machine according to claim 8, characterized by the fact that said marking unit (20) comprises an outer shell (30) with a terminal connection (50) at on e end of the outer shell, the pad (21) being housed at an opposite end of the outer shell, and a connection provided with pairs of pins (51, 52) for positioning and centering the fixture (6) on said plate (7).

12. A machine according to claim 8, characterized by the fact that said marking unit (20) is of a modular type, ring nut connections (70) being provided between said shell (30) and said terminal connection (50), to adapt its length to the height of the fixture (6).

13. A marking system fixture for circuit board testing machines for electrical testing of printed circuit boards, comprising a plurality of plates passed through by a plurality of contacts and a marking unit disposed within the fixture, characterized by the fact that the marking unit comprises at least one marking element having at least one mobile assembly which is connected to said at least one marking element and is movable between a resting position in which said at least one marking element is disposed inside the fixture and a working position in which the marking element extends from said fixture at said first side thereof for engaging a printed circuit board received on the fixture in order to mark it; and actuating means for initiating movement of said mobile assembly between said resting and working positions is provided at an opposite second side of the fixture, said actuating means comprising pin-actuatable elements for enabling triggering thereof by at least some of the plurality of contact pins of a testing machine in which said fixture is mountable other of said plurality of contact pins of the testing machine triggering said plurality of contacts.

14. A machine according to claim 13, characterized by the fact that the marking element (20) comprises an inked pad (21) and an actuator for axially moving the ink pad.

15. A machine according to claim 13, characterized by the fact that said mobile assembly comprises a motor (27), with a screw shaft (26) that engages with a female screw or screw nut (25) of a cylindrical element (24) supporting said pad (21) and blocked in rotation, so that a rotation of the screw (26) causes a translation of the cylindrical element (24) and thus of the pad (21).

16. A marking system according to claim 13, characterized by the fact that said marking element (20) comprises an outer shell (30) with a terminal connection (50) at one end of the outer shell, the pad (21) being housed at an opposite end of the outer shell, and a connection provided with pairs of pins (51, 52) for positioning and centering the mobile assembly on said plate (7).

17. A machine according to claim 13, characterized by the fact that said marking unit (20) is of a modular type, ring nut connections (70) being provided between said shell (30) and said terminal connection (50), to adapt it length to the height of the fixture (6).

\* \* \* \* \*